(12) United States Patent
Teers

(10) Patent No.: US 9,530,629 B2
(45) Date of Patent: Dec. 27, 2016

(54) METHOD FOR DEPOSITING MULTILAYER COATINGS

(75) Inventor: Dennis Teers, Worcs (GB)

(73) Assignee: Applied Multilayers LLC, Battle Ground, WA (US)

(*) Notice: Subject to any disclaimer, the term of this patent is extended or adjusted under 35 U.S.C. 154(b) by 518 days.

(21) Appl. No.: 12/395,208

(22) Filed: Feb. 27, 2009

(65) Prior Publication Data

US 2009/0236218 A1   Sep. 24, 2009

Related U.S. Application Data

(63) Continuation of application No. 10/529,315, filed as application No. PCT/GB03/04189 on Sep. 26, 2003, now abandoned.

(30) Foreign Application Priority Data

Sep. 26, 2002   (GB) ................... 0222331.1

(51) Int. Cl.
| | |
|---|---|
| *C23C 14/24* | (2006.01) |
| *H01J 37/34* | (2006.01) |
| *C23C 14/34* | (2006.01) |
| *C23C 14/35* | (2006.01) |
| *C23C 14/50* | (2006.01) |
| *C23C 14/56* | (2006.01) |

(52) U.S. Cl.
CPC ....... *H01J 37/3447* (2013.01); *C23C 14/3492* (2013.01); *C23C 14/352* (2013.01); *C23C 14/505* (2013.01); *C23C 14/568* (2013.01); *H01J 37/3405* (2013.01)

(58) Field of Classification Search
CPC .... C23C 14/542; C23C 14/505; C23C 14/352; C23C 14/3492; H01J 37/3447

USPC ............ 204/298.26, 298.11, 192.12
See application file for complete search history.

(56) References Cited

U.S. PATENT DOCUMENTS

| | | | |
|---|---|---|---|
| 3,515,663 | A | 6/1970 | Bodway |
| 4,022,939 | A | 5/1977 | Roth et al. |
| 4,888,199 | A | 12/1989 | Felts et al. |
| | | (Continued) | |

FOREIGN PATENT DOCUMENTS

| | | |
|---|---|---|
| GB | 2258343 | 2/1993 |
| JP | 63176465 | 7/1988 |
| JP | 63290257 A | * 11/1988 |

OTHER PUBLICATIONS

JP 04 045265, Japan Patent Abstracts.

*Primary Examiner* — Jason M Berman
(74) *Attorney, Agent, or Firm* — LeClairRyan, a Professional Corporation

(57) ABSTRACT

The invention relates to a method and apparatus for the generation of multilayered coatings onto substrates. Typically the apparatus used is a closed field unbalanced magnetron configuration in conjunction with one or more cylindrical and rotatable shields and a substrate carrier on which the substrates to be coated are carried. The shields and substrate holder are provided for rotation about a common axis of rotation. The shields are provided with apertures to allow the selective positioning of the apertures to define a passage or passages along which material from the targets can pass onto the substrates. The targets can be cleaned prior to the coating stage by operation of the targets with the shields selectively positioned to prevent the deposited material from reaching the substrates.

19 Claims, 4 Drawing Sheets

(56) References Cited

U.S. PATENT DOCUMENTS

| | | | |
|---|---|---|---|
| 4,988,422 A * | 1/1991 | Wirz | 204/192.15 |
| 5,454,919 A | 10/1995 | Hill et al. | |
| 5,556,519 A * | 9/1996 | Teer | 204/192.12 |
| 6,296,747 B1 * | 10/2001 | Tanaka | 204/298.07 |
| 6,315,877 B1 | 11/2001 | Fietzke et al. | |
| 6,365,010 B1 | 4/2002 | Hollars | |
| 6,645,354 B1 | 11/2003 | Gorokhovsky | |
| 2002/0064595 A1 | 5/2002 | Nomura et al. | |

* cited by examiner

METHOD FOR DEPOSITING MULTILAYER COATINGS

This application is a continuation of U.S. patent application Ser. No. 10/529,315, filed Mar. 25, 2005, which is a national stage application under 35 U.S.C. §371 from PCT Application No. PCT/GB2003/004189, filed Sep. 26, 2003, which claims the priority benefit of Great Britain Application No. 0222331.1, filed Sep. 26, 2002.

The invention to which this application relates is to the provision of a method for the deposition of multilayered coatings, in terms of layers of different materials or different material compositions, onto a substrate with the coating and/or the layers in the coating having controlled thickness characteristics.

The method utilised in this invention is based on sputtering and preferably magnetron sputter cathodes, and yet further, unbalanced magnetrons used in accordance with apparatus in the Patent GB2258343.

Conventionally, in a typical coating system with two magnetrons which face each other, the first magnetron is provided with a target of material A to be deposited on the substrate and the second magnetron is provided with a target of material B also to be deposited onto the substrate. Typically two power supplies are provided for each of the magnetrons and the conditions controlled via control of the power supplies so that the rate of deposition of material from the magnetron is controlled. The substrates are mounted on a central rotating holder and receive a coating flux from the targets so that material A and material B are alternatively applied to the substrate in layers to form a multilayer coating. The thickness of the individual layers of material is typically defined by the power level applied to the magnetrons and by the speed of rotation of the holder of the substrates.

A common problem with this method of application is that the interfaces between the respective layers in the coating are not well defined or sharp.

It has previously been proposed to solve this problem by providing the magnetrons in a manner so that they can be switched on and off to give alternative levels of control. An adaptation of this process is to provide shutters provided in front of each of the magnetron targets which can be operated to move between open and closed conditions to provide additional control.

The provision of shutters and/or switching on and off of magnetrons can provide difficulties in the control of the deposition. This is particularly problematic for the deposition of coatings for uses which have relatively low tolerance to coating imperfections and where imperfection can cause significant problems. An example of this is the application of coatings on optical substrates, where the required degree of control of both composition and thickness is extreme.

A further problem is that when the coating process is to include reactive sputtering i.e. the application of materials in a reactive gas in the coating chamber to form a particular material coating composition problems arise with regard to the control of the gas flow. The problems of controlling gas flow in turn mean that the control of the coating composition can be difficult and as a result the coating composition varies beyond acceptable coating parameters. With the use of conventional shutter arrangements it is not possible to establish stable gas flow in the coating chamber and/or stable magnetron target poisoning conditions behind the shutter. As a result, the electrical potential, magnetic field and gas flow close to the magnetrons is adversely affected.

The aim of the present invention is to provide a system for the control and application of multilayered coatings onto the substrate which avoids the control and application problems conventionally encountered.

In a first aspect of the invention there is provided Apparatus for the application of a coating of material or materials, said coating comprising at least first and second layers of material or material compositions, said apparatus including at least first and second magnetrons from which material can be selectively applied, a substrate holder, on which the substrates to be coated are held and characterised in that positioned between the magnetrons and the substrate holder, is at least one shield, said shield including at least one aperture through which material deposited from a magnetron can pass for application onto the substrates when the aperture is suitably positioned with respect to the said magnetron and substrate holder by selective rotation of the shield with respect to the magnetrons so as to define a passage through which the material deposited from the target of said magnetron can pass.

In one embodiment the magnetrons utilised are unbalanced magnetrons and yet further and preferably the magnetron deposition apparatus is in the form of a closed field unbalanced magnetron material deposition apparatus. In one embodiment the magnetron arrangement used is as disclosed in the patent GB2258343.

Typically, the movement of the shield in use means that when the aperture or any part of the aperture is not in front of a particular magnetron, deposition of the material onto the substrates from that magnetron is prevented or the amount of deposition is reduced.

Typically each shield provided is cylindrical and is rotated so that the aperture moves from a position in front of a first magnetron to a position in front of a second magnetron and so on, thus allowing, if desired, continuous operation of the magnetrons, so that deposition of a layered coating with alternate layers of materials from the targets of the first, second and further magnetrons is achieved.

Typically the substrate can be rotated and in one embodiment the holder rotates at a faster rate than the cylindrical shutter.

In a preferred embodiment the axis of rotation of the substrate holder is common with the axis of rotation of any of shield which is provided. This means that with the substrate holder substantially cylindrical and the shields which are provided being of cylindrical shape that the coating apparatus as herein described is symmetrical hence improving the controllability of the apparatus.

Typically, the thickness of the individual layers of material is controlled by the power applied to the magnetron and/or the time of a shield aperture being positioned in front of that particular magnetron. It is found that accurate and close control of the thickness of the material layer with improved and sharp interfaces between the layers is achieved by the invention.

Typically the magnetrons can be round or rectangular and the aperture is shaped so as to match the requirements for the particular magnetron shape used.

Typically, the size and shape of each aperture in the shield is chosen to ensure uniformity in the thickness of the material coating on the substrates.

Preferably two shields are provided, both typically cylindrical, and with one positioned inside the other and with common axes of rotation, and each having at least one aperture therein. The speed of rotation, direction of rotation and positioning of each shield can be independently controlled but with an aim of ensuring that when required the apertures in the respective shields are positioned so as to ensure that the deposition of material from the magnetron targets onto the substrates is entirely prevented during the preparation of the magnetron targets and, thereafter, the apertures are positioned at the correct location with respect to the magnetron targets to allow the selected and controlled deposition of material onto the substrates. In a further embodiment three or more shields can be provided between the substrate holder and the magnetron depositions means.

Typically, the shields have a radius so that one fits inside the other and both can be positioned close to the magnetrons or close to the substrates or any position between these extremes to suit particular coating requirements.

In one embodiment a range of shields can be provided to be selectively positioned in the coating chamber to suit particular coating requirements and may be replaced, as required, by alternative shields with different radii and/or aperture dimensions. Alternatively, shields can be provided which allows adjustment to provide suitable dimensions. When two shields are used it is only when the apertures in each are wholly or partially aligned that the material can pass through the same to be deposited onto the substrates.

It should also be appreciated that the apparatus and method herein described can be used for the non-reactive or reactive deposition of material to form the coatings on the substrates, the reactive sputtering being achieved by the controlled introduction of reactive gases as required.

In a further aspect of the invention there is provided a method for controlling the application of a multilayered coating onto at least one substrate in a coating chamber, said method comprising positioning a plurality of magnetrons with targets of material to be deposited in the coating chamber to face towards a substrate holder in the chamber, interposing between the substrate holder and the magnetrons, first and second shields, providing in said shields at least one aperture which, when selectively positioned with respect to a magnetron, allows material deposited from the magnetron target to pass therethrough and onto the substrates and characterised in that the shields are selectively rotatable so as to move and position the respective apertures to define a passage for selected periods of time to allow the passage of material deposited from a magnetron target and then to move the shields to repeat the same as required with respect to the first and second magnetrons as required to apply the multilayered coating onto the substrates.

In one embodiment the magnetrons are continuously operated during the deposition process to deposit material from the respective targets and when the apertures of the shields are not positioned to define a passage for the material the deposited material applies to the wall of the shield which faces the target.

Although it is envisaged that the operation of the targets to deposit material continuously may be advantageous in terms of control it is possible that when the apertures of the shields are not to be positioned to allow the passage of material from a particular target, then that target and magnetron may be moved to a shut down condition or a reduced operating condition so as to avoid or reduce respectively the deposition of material onto the shield wall and hence reduce material wastage. In this embodiment when the control system for the apparatus determines that a passage is to be provided in the near future for the deposition of material from said target, the magnetron and target are returned to full operating conditions.

In one embodiment, the movement of one or both of the shields is continuous. If continuous the speed can be varied or fixed to suit particular coating requirements. Alternatively, the movement of the shields is stepwise with a selected dwell time of the shields to allow a total blanking of the passage of deposited material or the maintenance of the apertures to define a passage in front of one or other or both of the magnetrons.

Typically, when two shields are provided they will be moved in opposing rotating directions.

In one embodiment the method includes the step of conditioning or preparing the material targets in each of the magnetrons to ensure that each is entirely clean prior to operation of the shields during which material is deposited from the magnetron targets without the presence of reactive gas and the shields positioned to prevent material from the targets reaching the substrates during this stage. In this case the shields are positioned such that the aperture(s) in one shield are spaced apart as far as possible from the aperture(s) in the other shield, the exact spacing and positioning being dependent upon each shield aperture configuration. The provision of the shields in this configuration ensures the prevention of material reaching the substrate surfaces and hence prevents the same from being adversely affected prior to the controlled application of the coating materials.

In one embodiment, when two shields are utilised, the relative positions of the apertures in each of the shields when forming a passage for the deposited material from a magnetron target can be selected to vary the width of the passage. For example, if the apertures are fully aligned a fully open passage is provided which allows a full deposition rate whereas, if only partially aligned, the size of the passage is reduced and hence the deposition rate to the substrates is reduced.

Typically, if the shields are rotated in the reverse direction to the direction of rotation of the substrate holder as this provides a more clearly defined "cut off" of the deposited material as the apertures leave a position in front of the magnetron.

In one embodiment one of the shields includes a greater number of apertures than the other thereby allowing for the selective positioning of the apertures to define material deposition passages.

In a further aspect of the invention there is provided a method for the control of operation of apparatus for applying a coating onto at least one substrate, said coating comprising a series of layers and said apparatus including within a coating chamber at least two magnetrons for the selective deposition of material from magnetron targets onto the substrates, and a plurality of cylindrical shields positioned between the targets and the substrate holder, said shields including apertures which can be selectively positioned to allow the passage of deposited material from the targets onto the substrates and characterised in that the method comprises the steps of:

preparing the targets by operating the magnetrons to deposit material from the targets in the coating chamber and positioning the shields to prevent the passage of deposited material onto the substrates; and applying a predetermined power level to the magnetrons and maintaining said power level during the application of the deposited material onto the substrates and the apertures in the shields are selectively positioned to allow the selective application of the material onto the substrates through passages defined by the apertures.

In one embodiment if the deposition of material is to be by reactive deposition the reactive gas is introduced into the coating chamber to a defined level after the magnetron target preparation steps have been completed and when the appropriate gas level is reached and maintained, the apertures in the shields are selectively positioned to allow the selective application of the material onto the substrates through passages defined by the apertures. As the magnetron targets are so effectively cleaned and prepared in accordance with the invention prior to the commencement of the deposition of material onto the substrates the defined level of reactive gas is selected with reference to the metal intensity of the target as prepared which is regarded as 100%.

As the current invention allows the accurate and controlled cleaning of the targets and the power level can be maintained at constant during the coating process as the targets continuously deposit material even if the apertures are not located adjacent the same, so it is the level of reactive gas introduced into the coating chamber which can be used as the controlling parameter to control the composition of the coatings on the substrates. This is in addition to control of any of the speed of rotation of the substrate holder and the speed and/or dwell time of the shields to allow more accurate control of the coating application, greater definition between the coating layers and the ability to provide a multilayered multi material coating which is dense, has good optical quality and can be closely defined in more easily repeatable coating procedures.

Typically the amount of reactive gas which is introduced into the chamber is in response to a user selection of a required percentage level of the metal intensity. Monitoring means are provided in the chamber and when the appropriate gas level is reached to match the percentage level the same is monitored for a period of time to ensure the same is stable and if so the gas continues to flow at that same rate. Thus this can be achieved by use of the Optical emission monitoring (OEM) method to control the gas flow and hence the composition of the coating. This method, to operate successfully depends on the operation commencing with "clean" targets and, as already explained above this is achieved with the current method and apparatus by the operation of the magnetrons and targets to sputter deposit the material prior to the introduction of any reactive gas into the coating chamber. Furthermore the ability to arrange the shields as described blocks the passage of the sputtered material to the substrates and hence ensures that there is no contamination of the substrates during this preparation stage. Typically the preparation and cleaning steps are further enhanced by applying a power level higher than that used during deposition.

Thus, in one embodiment the power level applied in the preparation step is higher than the power level applied during the coating stage.

As already stated the method for reactive material deposition can utilise Optical Emission Monitoring (OEM) for control purposes although it should be appreciated that other control systems can also be utilised as required.

A description of the prior art arrangements and specific embodiments of the present invention are now described with reference to the accompanying drawings wherein.

Figure 3A:
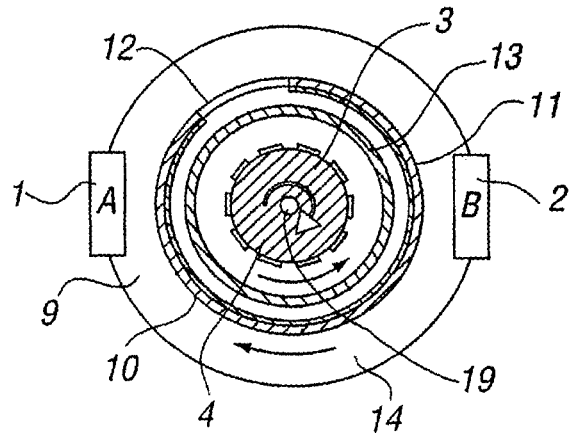
Figure 4:
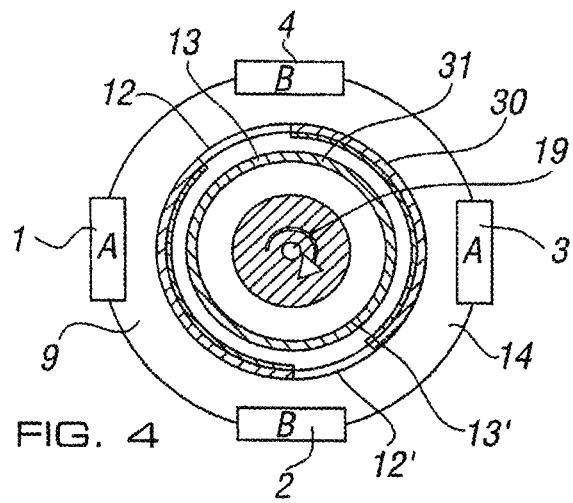
Figure 5:
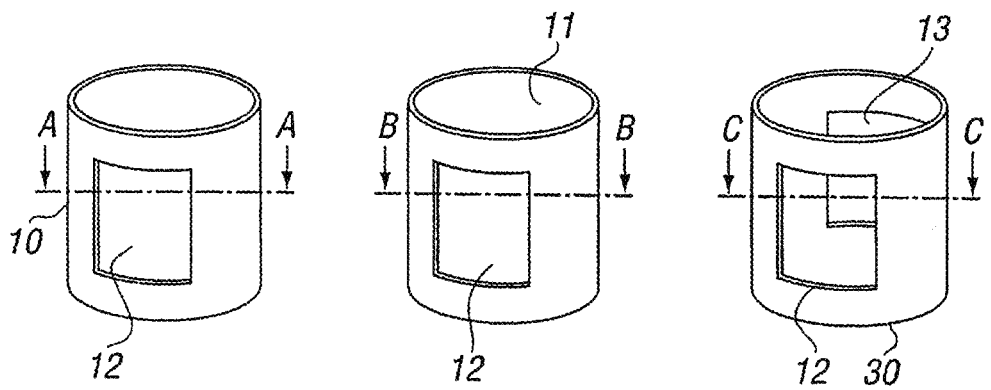
Figure 6:
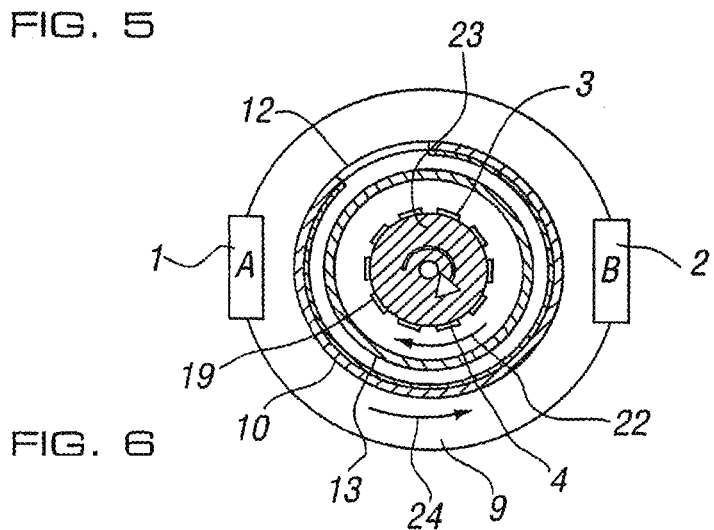

FIGS. 3a and b illustrate one embodiment of the present invention in plan with a cross section along line A-A of the shields of FIG. 5;

FIG. 4 illustrates a further embodiment of the invention in plan with a cross section along line C-C of the shields shown in FIG. 5;

FIG. 5 illustrates three shields in different embodiments in accordance with the invention; and FIG. 6 illustrates a further embodiment of the invention in plan with a cross section along lines A-A and B-B of the two shields in FIG. 5 to illustrate the aperture in each.

Figure 7:
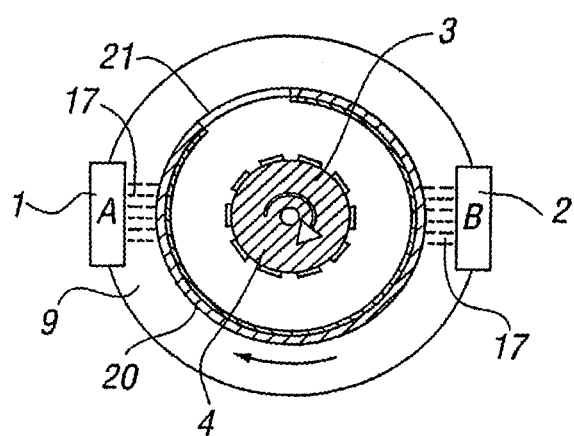

FIG. 7 illustrates a further embodiment of the invention in plan having a single cylindrical shield.

Figure 8:
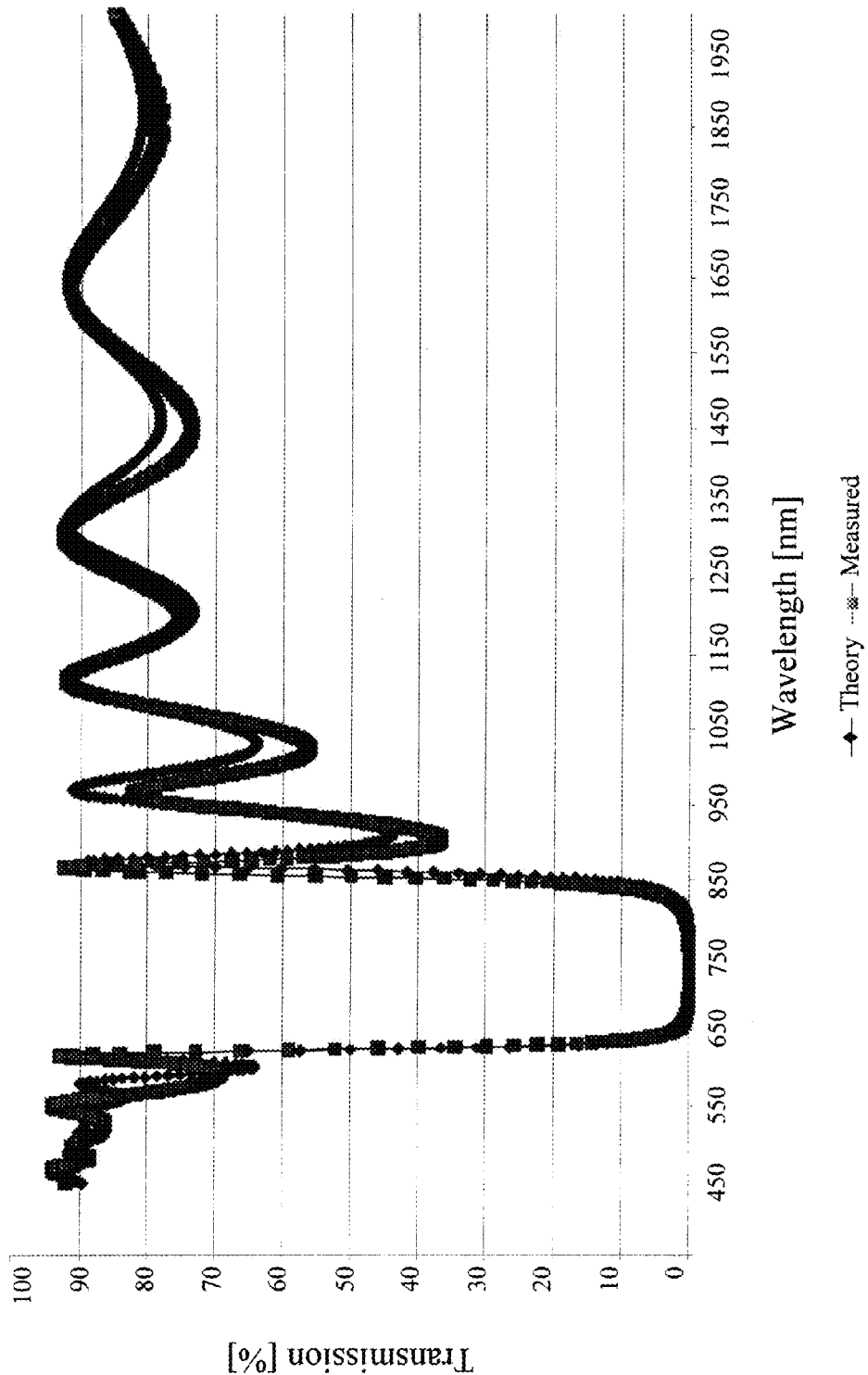

FIG. 8 is a graph illustrating the comparison of theory and measured spectral transmission profile of a $Nb_2O_5/SiO_2$ multilayer (nineteen layers) dielectric optical coating.

Figure 1:
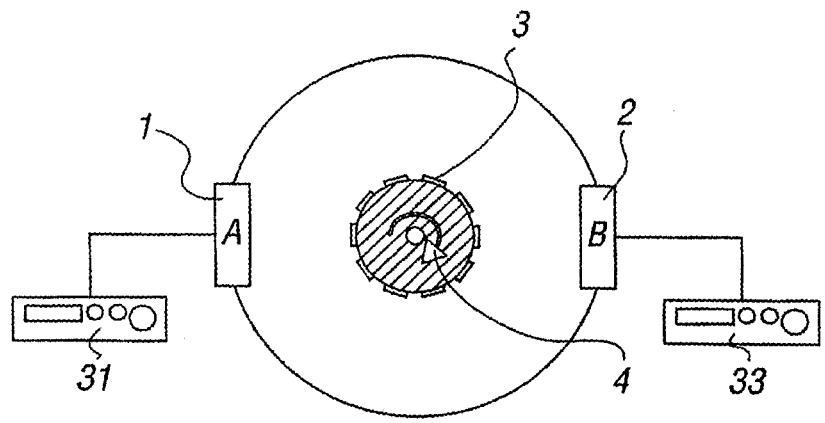
FIG. 1 illustrates a conventional, prior art coating system.

Referring firstly to FIG. 1 there is illustrated a coating system with two facing magnetrons, magnetron 1 with the target material A and magnetron 2 with target material B. In operation, power is applied to the magnetrons under controlled conditions via power supplies 31,33 respectively so that the substrates 3, which are mounted on a central rotating holder 4, receive a coating flux from targets A and B alternately and are as a result coated by a multilayer coating.

Figure 2:
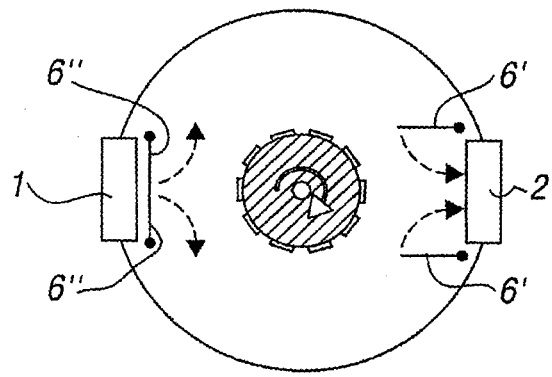
FIG. 2 illustrates the provision of shutters in a conventional manner.

FIG. 2 illustrates a known system of the type of FIG. 1 which includes a system to attempt to provide improved definition and sharpness between layers in the multilayer coating. The system comprises the provision of magnetrons 1 and 2 which can be switched on and off and also provided with shutters 6 which can be selectively open as shown by shutter 6' and closed, as shown by shutter 6" to provide additional control of the application of the coating material.

In FIG. 2 a "double door" shutter arrangement is used although this can be replaced by a single door or a sliding parallel door. What they all have in common is that for the conventional shutter to operate it needs to be close to the magnetron to provide a relatively small, typically the same size as the magnetron target, barrier close to the magnetron. If the conventional shutters were spaced any distance from the magnetron they would be less effective in blocking the coating flux. The present invention provides a solution to this problem and the general problem of preconditioning material targets effectively and the control of the material deposition in an effective manner.

The deposition system can be simple sputtering in which case the substrates can be at earth potential. Alternatively, sputter ion plating can be used in which case the substrate can be at any negative potential up to −5 kv but more typically about −50v. Furthermore the substrate can be provided at a floating potential but/and in order to ensure stable conditions during the deposition process, the shield can be earthed, floating or biased to a negative potential as required.

Figure 3B:
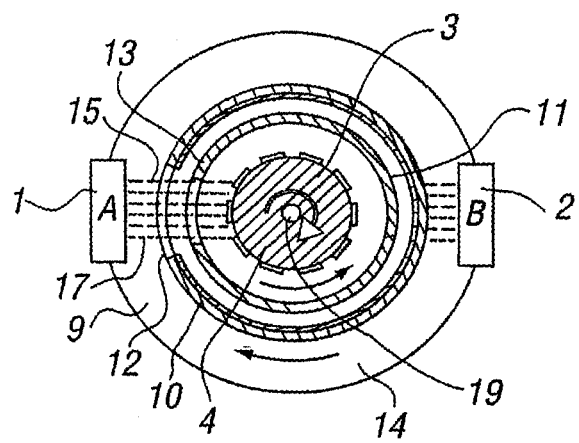

With reference to FIGS. 3a and b, one embodiment of the invention of the current application is shown with the apparatus and method used to deposit coatings in the following manner. The apparatus is provided in a coating chamber 9 and two shields 10, 11 are provided, both of which are cylindrical. The shield 10 is provided with an aperture 12 and the shield 11 is provided with an aperture 13. The aperture in each shield is located such that, by rotation of the shields each aperture can be selectively positioned in front of the other and, together, form a passage between either of the magnetrons 1, 2 and the substrate holder 4. In that position with the passage formed, as shown in FIG. 3b, material deposited 17 from the magnetron target A passes through the passage 15 defined by apertures 12,13 and onto the substrates 3 on the holder 4 which is rotated. The shields are selectively rotatable so that the apertures 12,13 can be moved between a position in front of one magnetron A, to a position in front of the other magnetron B, or indeed yet further magnetrons if provided, and then held with the aperture at the selected magnetron for the required time for depositing material from that magnetron onto the substrates to create a layer with the required depth.

FIG. 3a illustrates how the material 17 can be deposited from the targets A and B but if the apertures 12,13 are not aligned the material is simply deposited onto the wall of the shield 10.

Thus, with the shields provided, the magnetrons can be continually operated but, it is only when the apertures 12,13 are located in front of a magnetron, that the material from that magnetron target can reach the substrates.

The deposition method and apparatus as herein described can be used to deposit coatings in a non reactive gas such as argon and/or can be used for deposition of material in a reactive mode by the introduction of a reactive gas into the coating chamber 9. If nitrogen gas is introduced then nitride coatings can be deposited, if a hydrocarbon gas is introduced then carbide coatings can be deposited, if oxygen is introduced then oxide coatings can be deposited and so on. Yet further, it should be appreciated that coatings comprising pure metals or compounds produced by reactive methods can be produced.

When reactive deposition is to be provided the reactive gas flow into the chamber 9 can be controlled by a needle valve or mass flow valve or by magnetron power supply voltage variation or mass spectrometer control of gas partial pressures but preferably by a method relying on optical emission monitoring (OEM) with feed back control to a piezo electric valve would be used to ensure close control of the composition of the compound coating.

Using the OEM method it is necessary initially to establish the selected stable conditions for stoichiometric coatings. Movement of conventional shutters close to the magnetron targets affects the stability of the gas flow and so causes the deposition of coatings with undesirable compositions. Also movement of the conventional types of shutter can affect the magnetic field and plasma conditions of the magnetron and cause variations in deposition rates.

The shields 10,11 in accordance with this invention have several advantages. Because of the fact that the shields and substrate holder 4 and configuration of the deposition apparatus can all be in a substantially cylindrical form and with a common central axis 19 so the apparatus is symmetrical and hence the substrate holder and particularly the shields have very little and significantly reduced affect on the stability of the system as they rotate. Also the shields can be positioned at different radii and the optimum radius for each can be selected so that any effect on stability is minimised as the cylindrical shields rotate. Also it is easy to bias the cylindrical shields electrically and the optimum bias for stability can be selected.

When controlling the thickness of layers applied to close tolerances it is necessary to maintain stability at the sputter magnetrons and any shield movement should change the magnetic and plasma environment at the sputter electrodes as little as possible. This is particularly true for magnetron electrodes. During deposition of compound coatings by reactive techniques the deposition conditions are particularly sensitive to changes in the magnetic and plasma environment of the sputter electrode. A conventional shutter of the type shown in FIG. 2 will influence the flow of gas to the sputter target causing serious instability in the control of coating composition. As the cylindrical shields in accordance with the invention are symmetrical, and can be sufficiently distant from the sputter electrode they have little effect on the magnetic and plasma environment at the electrode and have little effect on the gas flow conditions close to the electrode. Also, the electrical potential of the shields can be selected to minimise any effects on the potential field of the whole deposition system and the conditions close to the substrates are maintained stable.

It has been found that a particularly successful and simple arrangement is to position the shield between the substrates and unbalanced magnetron sputter electrodes in a closed field unbalanced magnetron (CFUBM) deposition arrangement as in the patent previously mentioned. For most coatings a substrate bias voltage of less than −50v ensures excellent coating quality. Under these conditions the floating potential of the cylindrical shutter is about −20v and good long term stability is maintained in the system as the shutter is moved.

The applied bias can be RF or DC with RF provided for insulating substrates or insulating coatings. One convenient method is to have both the substrates and the shields floating.

For most compound coatings deposited reactively, the OEM control method ensures that the reactive gas flow can be controlled adequately at one of the magnetrons. The power on the other magnetrons can be selected so that it produces stoichiometric coating at the gas flow resulting from the control system at the first magnetron. The required layer thicknesses can then be obtained by controlling the dwell time for the passage formed by the apertures in the shields in front of each target.

It may be necessary to have separate OEM gas flow control systems at two or more magnetrons but these can relatively easily be provided.

The provision of two shields 10,11 also means that movement of the shields is sufficiently rapid to give the required sharpness of interface between the layers of the applied coating. Typically, both shields can be independently controlled and can, in one embodiment be rotated in opposite directions 24, 22 as shown in FIG. 6 or, alternatively, both could be moved in the opposite direction to the rotation 23 of the substrate holder. The two shield arrangement also has the advantage that the magnetrons A, B can be run with no possibility of deposition on the substrates 3 when the apertures 12, 13 in the two shields 10, 11 are out of line as also shown in FIG. 6. This is an important feature as, during the preparation of the magnetrons the targets of the same are operated to sputter deposit material which acts as a cleaning step and established the required stable conditions. The provision of the two shields with the apertures out of line and removed from the magnetron locations ensures that none of the sputtered material can reach the substrates.

The examples given so far are for a two magnetron system. The method is suitable for multi magnetron systems with any number of magnetrons. For a 4 magnetron system as shown in FIG. 4 two cylindrical shields 30,31 are provided and each, in this embodiment, is provided with two apertures, although it should be appreciated that the number of apertures provided and the spacing of the same is dependent upon the particular coating requirements and configurations. Here, magnetrons 1 and 3 have targets of the same material A and magnetrons 2 and 4 have targets of material B. However it should be appreciated that in other embodiments each of the magnetrons can have a target of a different material or other combinations of target materials can be used to suit particular coating formation requirements. Two diametrically opposed apertures 12,12' in shield 30 and 13,13' in shield 31 are positioned as shown. This method is similar to that for the two magnetron system but, in this example, gives double the deposition rate of materials A or B as the same can be deposited from the two magnetron pairs, 1,3 or 2,4, respectively through the two passages defined by the apertures 12,13 and 12',13' respectively.

FIG. 5 illustrates three shields 10, 11 and 30 which can be selectively used and each can be selectively used individually or in combination for any of the embodiments shown in FIGS. 3a,b, 4 and 6 to suit particular purposes. The drives used to rotate and stop the shields can be any suitable powered and controlled drive means.

Another embodiment of the invention is shown in FIG. 7 where there is provided the coating chamber 9 with the rotatable substrate holder 4 and substrates 3 thereon. In this embodiment a single cylindrical shield 20 is used with an aperture 21. Again two magnetrons 1,2 are provided with materials A,B respectively. The operating method is similar to that previously described with respect to the two shield arrangement with the passage 15 being formed by the provision of the aperture 21 at the required location with respect to the magnetrons. In practice it has been found that the use of the two shields ensures maximum stability and gives excellent control of layer thickness by ensuring the improved preparation of the targets and avoiding the deposition of material from the targets onto the substrates during the target preparation stage.

It will also be seen from the embodiment of the invention described that the shields can be positioned a significant distance away from the magnetrons in contrast to the conventional system where the shutter is required to be positioned close to the magnetron to be most effective. Thus the present invention allows the shield to be associated with the position of the substrates to be coated rather than the magnetron positions. This in turn allows the improved efficiency of the shield with the aperture controlling the area of the application of the material rather than conventional systems where the shutter is required to close the aperture in order to prevent application of material which is frequently not effective.

When the magnetrons and target are operated continuously in accordance with one operating embodiment of the invention there is the disadvantage that the material from one magnetron (or 2 magnetrons in the case of the 4 magnetron system) is not exposed to a passage to the substrates and so that material is deposited on the surface of the cylindrical shield. However this disadvantage is of less importance than the improvements in stability and operating control which is achieved by the invention. However if one or both of the targets in a non reactive coating process, was a precious metal such as gold or platinum the same could be recovered from the surface of the cylindrical shield with close to 100% recovery rate.

There is now provided a specific example of operation of apparatus and utilisation of the method in accordance with the invention;

By way of example, a coating comprising nineteen layers [alternate layers of niobia and silica] was deposited using the apparatus and method as herein described with the cylindrical shields each having an aperture therein. The target in each magnetron was either of niobia or silica. The specific thicknesses of each layer of material applied were controlled by exposing the substrate to the magnetron with relevant target material for the necessary time to achieve the required layer thickness.

On completion of each layer, the cylindrical shields were rotated such that the apertures in the same formed a passage to the magnetron with the alternate material and the shields maintained in this position until the required thickness of that material layer was deposited. The steps were then repeated for the next material layer and so on until the required nineteen layers had been applied.

FIG. 8 shows the comparison of a theoretical spectral transmission characteristic of the optical coating with the measured spectral transmission characteristic of the nineteen layer multilayer optical coating formed utilising the invention as described above.

It is clearly seen from FIG. 8 that there is extremely close agreement between the theory and measured data. This indicates that the individual layer thickness control to <±1% has been achieved.

What is claimed:

1. A method for controlling the application of a multilayered coating onto at least one substrate in a coating chamber, said method comprising:

positioning a plurality of unbalanced magnetrons with targets of material to be deposited in the coating chamber to face towards a substrate holder in the chamber, interposing between the substrate holder and the magnetrons, first and second shields, providing in said shields at least one aperture which, when selectively positioned with respect to a magnetron, allows material deposited from the magnetron target to pass therethrough and onto the substrates and characterised in that the shields are rotated during magnetron activation, with the movement of one or both of the shields being continuous at a selected speed which can be varied or fixed to suit particular coating requirements, so as to move and position the respective apertures to define a passage for selected periods of time to allow the passage of material deposited from a magnetron target and then to move the shields to repeat the same as required with respect to the first and second magnetrons as required to apply the multilayered coating onto the substrates, and arranging the magnetrons in a closed field unbalanced magnetron (CFUBM) configuration with adjacent unbalanced magnetrons have outer magnetic assemblies of opposite polarity;

wherein the shields and substrates are provided at floating electrical potential during the coating application and the speed of rotation of the shields is independently controlled.

2. A method according to claim 1 characterised in that the magnetrons are continuously operated during the deposition process to deposit material from the respective target and when the apertures of the shields are not positioned to define a passage for the material the deposited material applies to the wall of the shield which faces the target.

3. A method according to claim 1 wherein when no passage is defined by the shield apertures at a particular magnetron at a particular time during the coating procedure that magnetron can be moved to a shut down or standby condition.

4. A method according to claim 1 wherein a reactive gas is introduced into the coating chamber during the coating procedure to allow the deposited material to form a compound material on the substrates.

5. A method according to claim 1 characterised in that the method includes the step of conditioning or preparing the material targets in each of the magnetrons prior to operation of the shields to form deposition passages, during which preparation stage material is deposited from the magnetron targets and the shields are positioned to prevent material from the targets reaching the substrates.

6. A method according to claim 1 characterised in that the relative positions of the shields when forming a passage for the deposited material from a magnetron target are selected to define the width of the passage defined by the apertures.

7. A method according to claim 6 wherein the apertures are positioned in line to define a full width passage.

8. A method according to claim 6 wherein the apertures are offset or of differing widths to define a passage of a width less than the width of the largest width aperture.

9. A method for the control of operation of apparatus for applying a coating onto at least one substrate, said coating comprising a series of layers and said apparatus including within a coating chamber at least two unbalanced magnetrons for the selective deposition of material from magnetron targets onto the substrates, and a plurality of cylindrical shields positioned between the targets and the substrate holder, said shields including apertures formed therein which can be selectively positioned to define a passage for deposited material from the targets onto the substrates and characterised in that the method comprises the steps of:
preparing the targets by operating the unbalanced magnetrons to deposit material from the targets in the coating chamber and positioning the shields to prevent the passage of deposited material onto the substrates;
applying a predetermined power level to the magnetrons and maintaining said power level during the application of the deposited material onto the substrates and continuously rotating the shields during such application, whereby the apertures in the shields are selectively positioned to allow the selective application of the material onto the substrates through passages defined by the apertures;
configuring the magnetrons in a closed field unbalanced magnetron (CFUBM) configuration with adjacent unbalanced magnetrons having outer magnetic assemblies of opposite polarity; and
selecting the speed of rotation of the shields;
wherein the substrates and shields are provided at floating electrical potential when applying the coating, and wherein either (i) the plurality of shields are continuously rotated in opposite directions during application of deposited material onto the substrates, or (ii) the plurality of shields are continuously rotated in a direction opposite to rotation of the substrate holder during application of deposited material onto the substrates.

10. A method according to claim 9 wherein the deposition of material is to be by reactive deposition and a reactive gas is introduced into the coating chamber to a defined level after the magnetron target preparation steps have been completed.

11. A method according to claim 10 wherein when the appropriate gas level is reached and maintained, the apertures in the shields are selectively positioned to allow the selective application of the material onto the substrates through passages defined by the apertures.

12. A method according to claim 10 wherein monitoring means are provided in the coating chamber and when the appropriate gas level is reached to match a predetermined value the same is monitored for a period of time to ensure the same is stable and if so the gas continues to flow at that same rate.

13. A method according to claim 12 wherein a gas control method is used including any of magnetron power supply voltage variation or mass spectrometer control of gas partial pressures.

14. A method according to claim 12 wherein Optical emission monitoring (OEM) is used to control the gas flow.

15. A method according to claim 14 wherein OEM is used to control the reactive gas flow at the required level for a stoichiometric coating to be applied to the substrates.

16. A method according to claim 10 wherein the power level applied to the magnetrons during the preparation stage is higher than that applied during the material deposition.

17. A method according to claim 10 wherein stable operating conditions are established prior to the deposition of the material onto the substrates by enabling the preparation and cleaning of the targets without contaminating the substrates by positioning the shields to prevent the passage of the material onto said substrates during the preparation stage.

18. The method according to claim 1, wherein the first and second shields are continuously rotated in opposite directions during magnetron activation.

19. The method according to claim 1, wherein the first and second shields are continuously rotated in a direction opposite to rotation of the substrate holder during magnetron activation.

* * * * *